US005498898A

United States Patent [19]
Kawamura

[11] Patent Number: 5,498,898
[45] Date of Patent: Mar. 12, 1996

[54] SEMICONDUCTOR DEVICE USING ELEMENT ISOLATION BY FIELD SHIELD

[75] Inventor: Koichiro Kawamura, Tokyo, Japan

[73] Assignee: Nippon Steel Corporation, Tokyo, Japan

[21] Appl. No.: 362,784

[22] Filed: Dec. 23, 1994

[30] Foreign Application Priority Data

Dec. 28, 1993 [JP] Japan .................................. 5-351920

[51] Int. Cl.⁶ .................................................... H01L 29/00
[52] U.S. Cl. .......................... 257/503; 257/508; 257/409; 257/630; 257/913
[58] Field of Search ..................................... 257/372, 394, 257/409, 488, 503, 508, 630, 659, 913

[56] References Cited

U.S. PATENT DOCUMENTS 5,164,806  11/1992  Nagatomo et al. ..................... 257/409

OTHER PUBLICATIONS

Wakayama et al., Fully Planarized 0.5 μm Technologies for 16M Dram, IEDM-88, 1988, pp. 246–279.

Primary Examiner—Rolf Hille
Assistant Examiner—Minhloan Tran
Attorney, Agent, or Firm—Pollock, Vande Sande & Priddy

[57] ABSTRACT

A semiconductor device comprises a semiconductor substrate a field-shield electrode made of a thin film of at least one of polysilicon and amorphous silicon and formed on a surface of an element-isolation region of the substrate with an insulating film interposed therebetween for defining an active region in the substrate and a transistor having a gate electrode formed on a surface of the active region of the substrate with a gate insulating film interposed between the substrate and the gate electrode wherein the field-shield electrode is connected to a predetermined potential and the insulating film has a thickness of 5 nm–10 nm which is less than a thickness of the gate insulating film of the transistor.

4 Claims, 5 Drawing Sheets

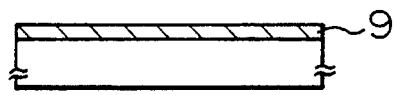
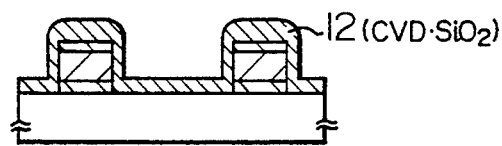
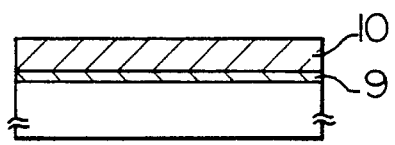
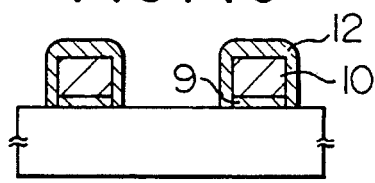
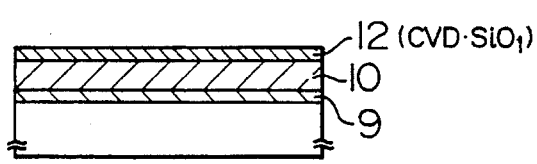
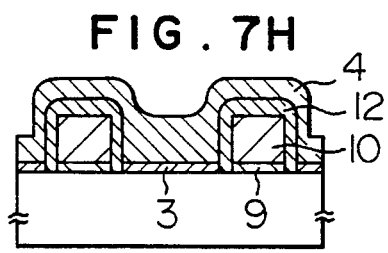
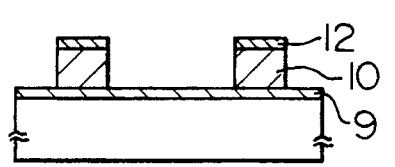
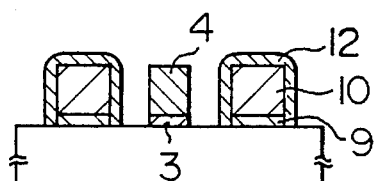
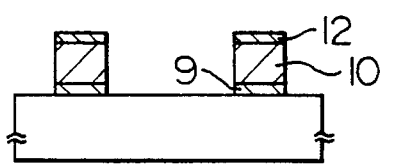
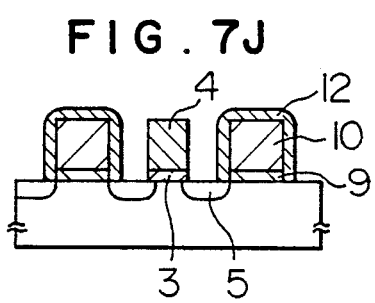

SEMICONDUCTOR DEVICE USING ELEMENT ISOLATION BY FIELD SHIELD

BACKGROUND OF THE INVENTION

1. Field of the Invention

The present invention relates to a semiconductor device using a field shield element-isolation and a method of making such a semiconductor device, and particularly to a semiconductor device using a field shield element-isolation in which heavy metal impurities contained in a silicon substrate are removed and a method of making such a semiconductor device.

2. Description of the Related Art

Recently, attention is directed to an element isolating method called a field shield method since in this method in that the potential of a parasitic transistor can be effectively cut off by fixing the field shield (gate) electrode to a ground potential or a predetermined potential and the interval between active regions can be reduced thus, this method is suitable for making a semiconductor device very small in size. An example of the method is disclosed by Wakayama et al. in "Fully Planarized 0.5 μm Technologies for 16M DRAM" IEDM-88, 1988, pp. 246-249.

FIG. 8 shows a structure of a MOS transistor in which the field shield element-isolation by the method shown in the above-mentioned literature is applied. In this structure, after a field shield oxide film 22 of 50 nm thickness is formed first on a silicon substrate 21, boron ions are doped by ion implantation into an underside of the oxide film 22 under the condition of dose rate of $10^{12}$ ions/cm$^2$ and implantation energy of 20~40 Kev in order to perform threshold adjustment for transistors 23 formed in active regions and parasitic MOS transistors in the element-isolation region. Thereafter, a field shield electrode 24 is formed of phosphor-doped polysilicon, at a thickness of 200 nm, a gate oxide film 25 and a gate electrode 26 of each transistor 23 are formed, and then source/drain regions 28 are formed by impurity diffusion.

By fixing the field shield electrode 24 to the ground potential GND, the transistor formed of the respective source and drain of adjacent active transistors 23 cannot turn on so that the elements, i.e. the transistors can be isolated properly from each other.

In the case where the conventional field shield method is used, however, unlike a known LOCOS (local oxidation of silicon) method, there is no layer for absorbing or gettering heavy metal impurity elements such as Fe, etc. contained in the silicon substrate and therefore no effective gettering. Accordingly, the impurity elements remain in the silicon substrate even after formation of a semiconductor device so that deterioration of transistor characteristic such as increase of junction leakage current, etc., resulting in a serious factor for reduction of the yield in manufacturing.

SUMMARY OF THE INVENTION

An object of the present invention is to provide a semiconductor device using field shield element-isolation by, in which heavy metal impurities contained in a silicon substrate are removed so that deterioration of element characteristic can be prevented and to provide a method of making such a semiconductor device.

A semiconductor device according to the present invention comprises; a semiconductor substrate; and a field-shield electrode of polysilicon thin film formed on a surface of an element-isolation region of the semiconductor substrate with an insulating film interposed therebetween. The field shield electrode is fixed to a predetermined potential and the insulating film has a thickness of 5 nm~10 nm.

A method of making a semiconductor device according to the present invention comprises: a step of forming a field shield electrode of a thin polysilicon film on an element-isolation region of a semiconductor substrate with an insulating film having a thickness of 5 nm~10 nm interposed therebetween; and at least a step of applying heat treatment at 700° C. or more to the semiconductor substrate on which the field shield electrode is formed.

It is known that polysilicon is suitable for gettering of heavy metal elements in a silicon substrate. When this polysilicon is used for a field shield electrode film and the thickness of an insulating film is set to 10 nm or less, and heat treatment at 700° C. or more is applied to the whole semiconductor substrate after the field shield electrode film has been formed thereon, the heavy metal elements in the silicon substrate are gettered through the insulating film into the polysilicon thin film which is located above the insulating film. Thus, heavy metal elements in the silicon substrate disappear after transistors are formed in active regions and the element characteristic is not deteriorated.

If the thickness of the insulating film is less than 5 nm, a leakage current due to a tunnel effect is generated so that the insulating property is remarkably lowered under the condition that the absolute value of the potential difference between the thin polysilicon film and the silicon substrate is 5 V or less as is ordinarily used, while if the thickness of the insulating film exceeds 10 nm, the efficiency of gettering becomes remarkably lower depending on the kind of the heavy metal elements in the silicon substrate.

BRIEF DESCRIPTION OF THE DRAWINGS

FIGS. 7A-7J are sectional views corresponding to FIG. 2 in the respective steps of FIG. 6.

DESCRIPTION OF THE PREFERRED EMBODIMENTS

Referring now to FIGS. 1–5, the structure of a semiconductor device according to an embodiment of the present invention will be described.

Figure 1:
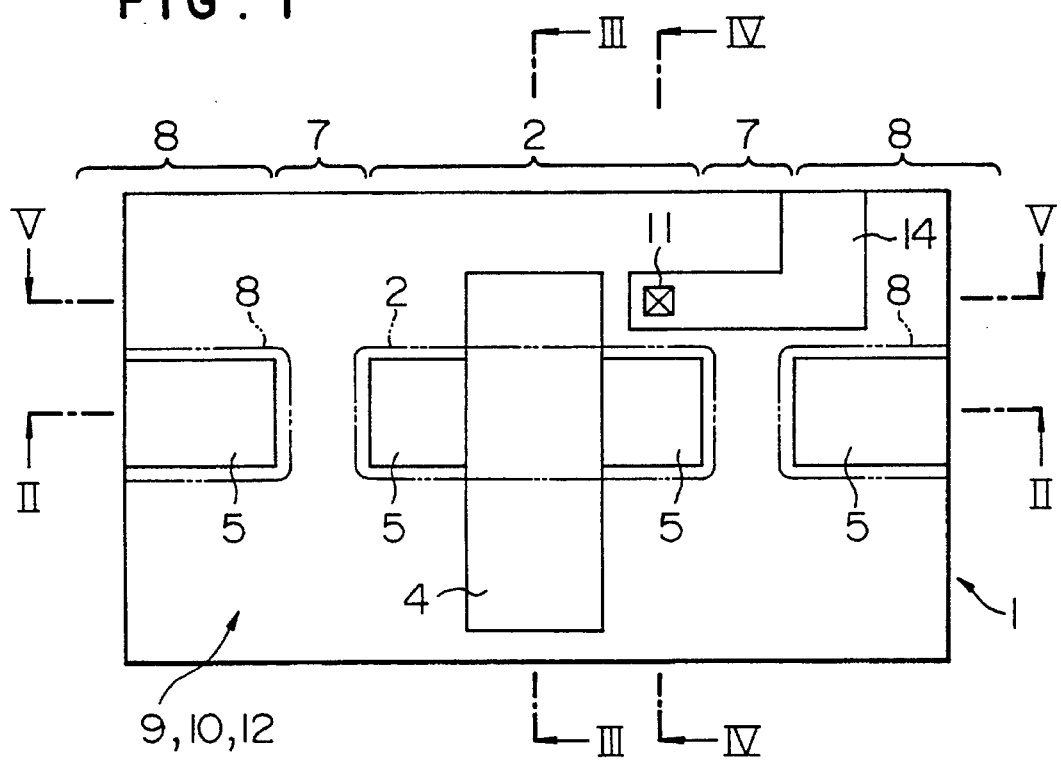
FIG. 1 is a plan view showing main part of an MOS transistor of a DRAM memory cell and an element-isolation region according to an embodiment of the present invention.
Figure 2:
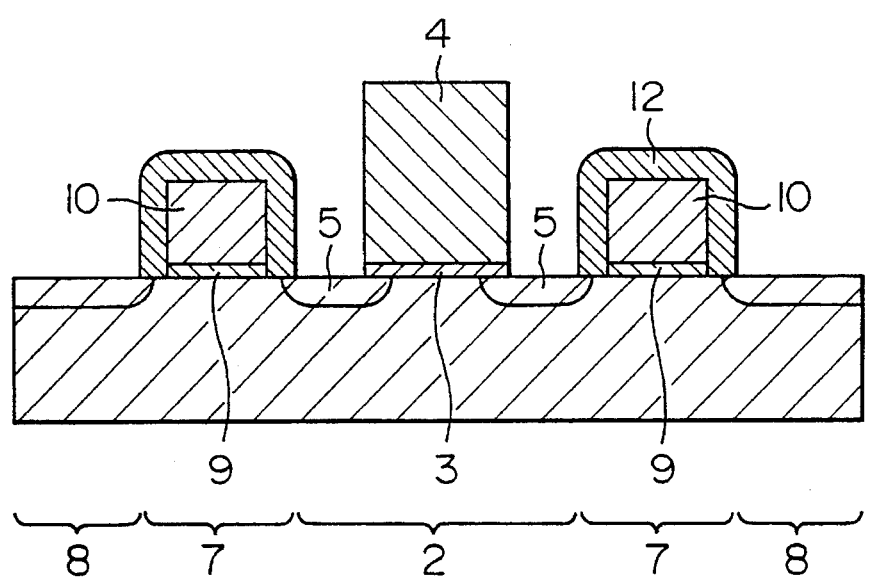
FIG. 2 is a sectional view along a line II—II in FIG. 1.
Figure 3:
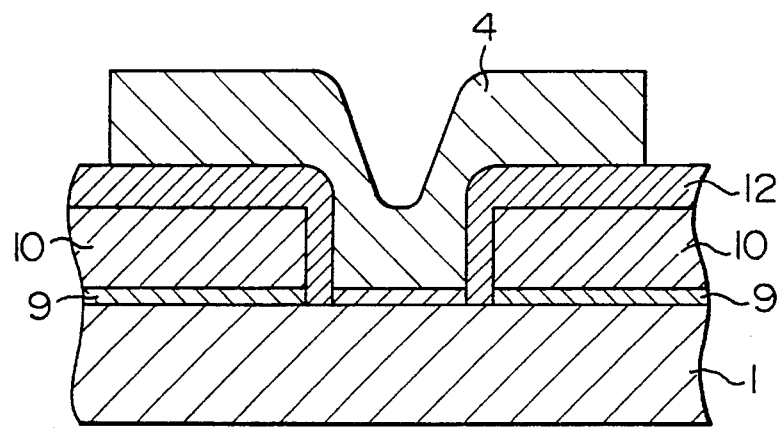
FIG. 3 a sectional view along a line III—III in FIG. 1.
Figure 4:
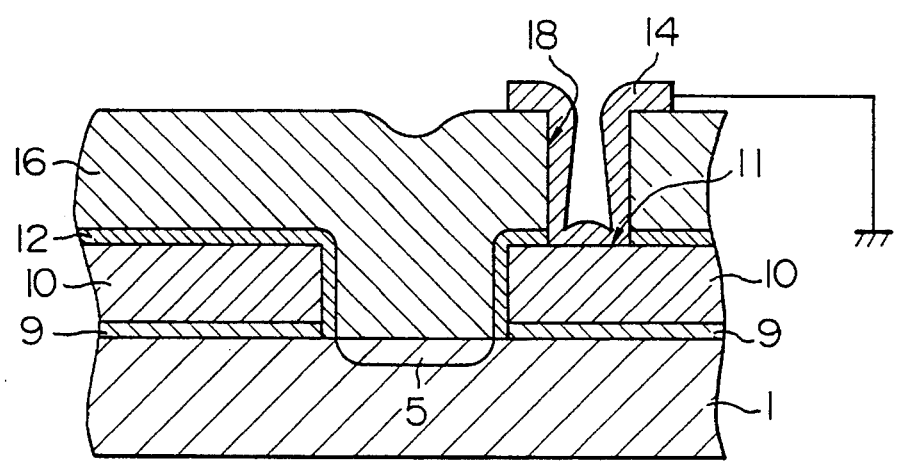
FIG. 4 is a sectional view along a line IV—IV in FIG. 1.
Figure 5:
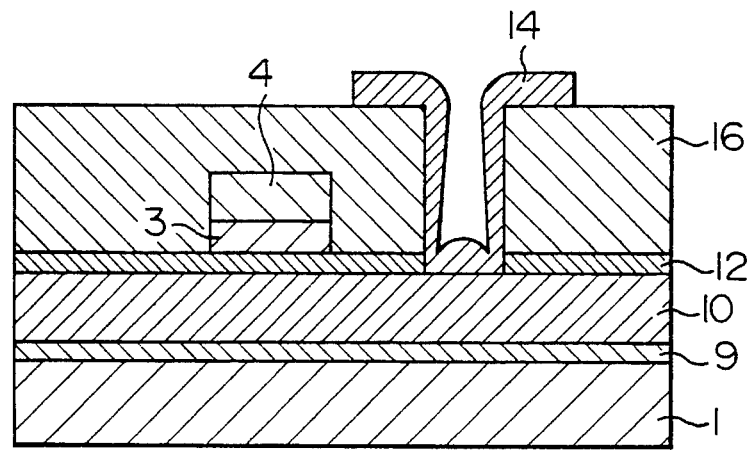
FIG. 5 is a sectional view along a line V—V in FIG. 1.
Figure 6:
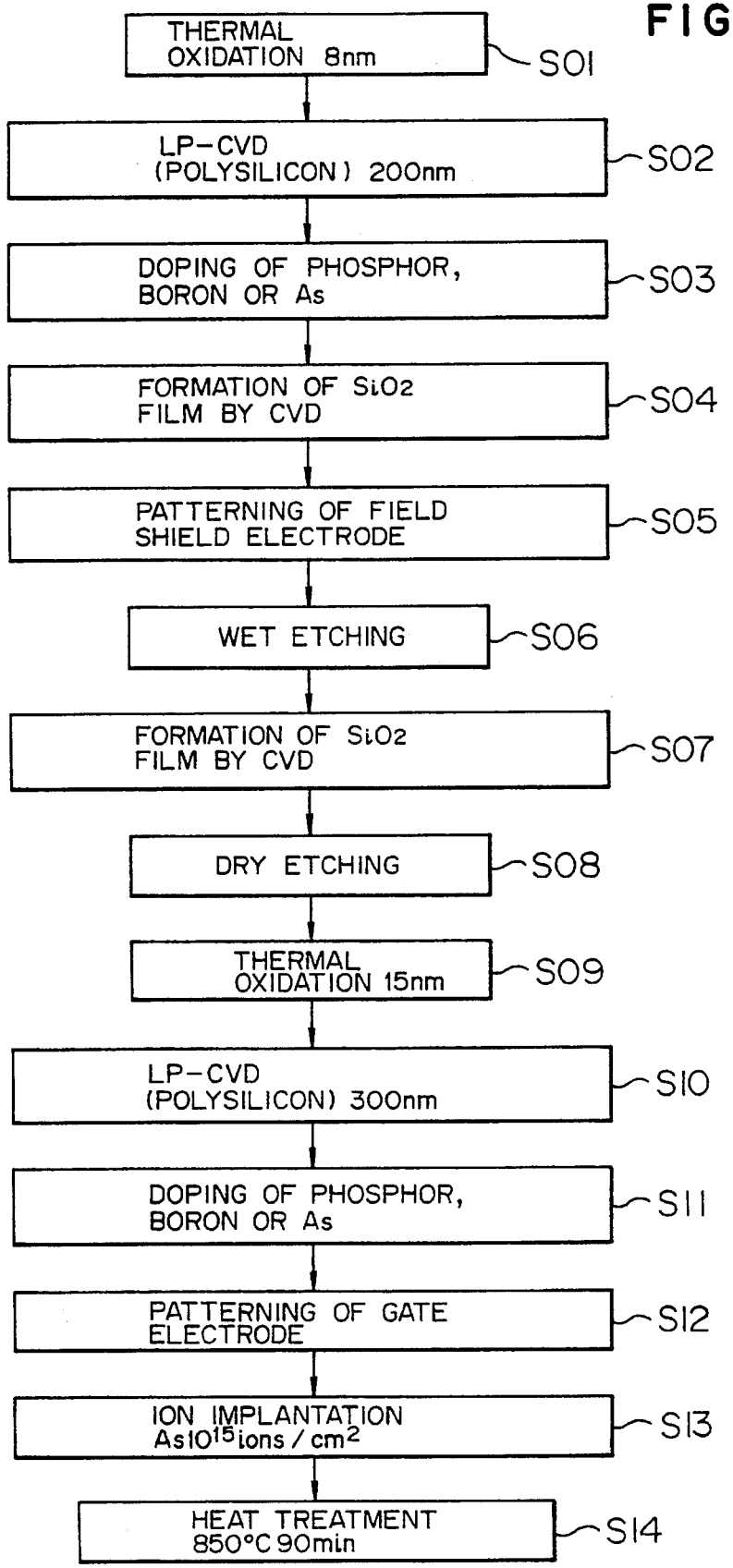
FIG. 6 is a flow chart showing the steps of the method of making the semiconductor device according to an embodiment of the present invention.
Figure 8:
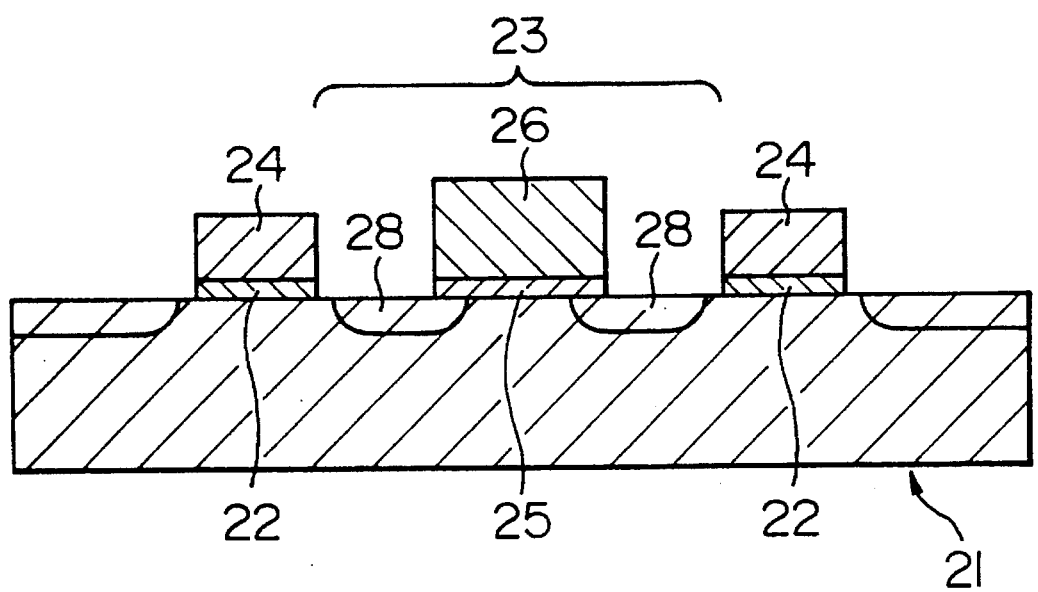
FIG. 8 is a sectional view corresponding to FIG. 2 showing the structure of a conventional semiconductor device.

As shown in FIGS. 1–5, a gate electrode 4 is formed on an active region 2 of a P-type silicon substrate 1 with a gate oxide insulating film 3 interposed therebetween and N-type impurity diffusion regions 5 are formed on the opposite sides of the gate electrode 4. An MOS transistor is constituted by the gate electrode 4 and the impurity diffusion regions 5. In FIG. 1, each of the regions 2 surrounded by a two-dotted chain line is an active region where a transistor is formed and the region other than the active regions is the element-isolation region.

An impurity diffusion region 5 of another MOS transistor 8 is formed adjacent to each of the pair of N-type impurity diffusion regions 5 of the first-mentioned MOS transistor with the element-isolation region 7 therebetween. A field shield electrode 10 is formed in the element-isolation region 7 with an oxide insulating film 9 interposed therebetween. Here, the oxide insulating film 9 between the field shield electrode 10 and the substrate 1 has a thickness in a range of from 5 nm to 10 nm, for example 8 nm. An inter-layer insulating film 12 is formed so as to cover the field shield electrode 10, and another inter-layer insulating film 16 is formed so as to cover the transistor gate electrode 4 and the inter-layer insulating film 12. A hole 18 is formed through the inter-layer insulating film 16 so as to reach the field shield electrode 10. A conductive layer 14 made of an electrically conductive material such as aluminum extends into the hole 18 and is electrically connected to the field shield electrode 10 at a contact 11. The field shield insulating film 9, the field shield electrode 10 and the inter-layer insulating films 12 and 16 are successively formed on the substrate at the element-isolation region other than the regions 2 where transistors are formed in FIG. 1. In FIG. 1, in order to clarify the arrangement of the gate electrode 4 and the field shield electrode 10, the inter-layer insulating film 16 is omitted, and in FIGS. 2 and 3, in order to simplify the drawing, the inter-layer insulating film 16 is also omitted.

In operation of this semiconductor device, the substrate and the field shield electrode are connected to predetermined potentials respectively so that the absolute value of the difference between the respective potentials of the substrate and the field shield electrode is not higher than 5 V. For example, the P-type silicon substrate 1 is connected to (½)Vcc (−2.5 V) (not shown) and the field shield electrode 10 is connected to the ground potential through the contact 11, the conductive layer 14 (FIG. 4) through another contact (not shown). Here, Vcc represents a power source voltage.

Next, referring to FIGS. 6, 7A–7J, the method of making the semiconductor device according to an embodiment of the present invention will be described.

First, as shown in FIG. 7A, an oxide insulating film 9 is formed at a thickness of 8 nm by thermal oxidation on a surface of a P-type silicon substrate 1 (S01). Next, as shown in FIG. 7B, a polysilicon thin film 10 is formed at a thickness of 200 nm by a low pressure CVD method on the insulating film 9 (S02), and N-type impurities such as phosphor, arsenic, or the like, are ion-implanted into the polysilicon thin film 10 (S03). Further, as shown in FIG. 7C, a silicon oxide film 12 is formed at a thickness of 100 nm by a CVD method on the polysilicon thin film 10 (S04). Next, as shown in FIG. 7D, the polysilicon thin film 10 and the silicon oxide film 12 which have been formed in the active region of the substrate are etched by photolithography and dry etching so that a field shield electrode 10 covered with an oxide insulating film 12 is formed at a portion which is made to be an element-isolation region (S05).

Thereafter, the oxide insulating film 9 exposed in the active region is removed by wet etching using HF (FIG. 7E, S06). Next, a silicon oxide film 12 is formed at a thickness of 200 nm by a CVD method over the whole surface of the substrate (FIG. 7F, S07), and then the silicon oxide film 12 on the active region is removed by dry etching so that the oxide insulating film 12 remains only on the upper and side surfaces of the field shield electrode (FIG. 7G, S08). Next, a gate oxide film 3 is formed at a thickness of 15 nm on the substrate surface exposed in the active region by heat treatment at 850° C. for 30 minutes (S09).

Next, after a polysilicon film is formed at a thickness of 300 nm by a low pressure CVD method (FIG. 7H, S10), N-type impurities such as phosphor, arsenic, or the like, are ion-implanted into the polysilicon film (S11), and then patterning is conducted to form a gate electrode 4 of a transistor by photolithography and dry etching (FIG. 7I, S12). Next, arsenic is ion-implanted at a dose of $10^{15}$ ions/cm$^2$ into the surface of the P-type silicon substrate exposed in the active region using the gate electrode 4 of the transistor and the field shield electrode 10 as a mask (S13), and heat treatment is conducted at 850° C for 90 minutes (FIG. 7J, S14) to thereby form N-type impurity diffusion regions 5 of the transistor.

Thereafter, an inter-layer insulating film 16 is formed all over the substrate, a hole 18 is formed in at least one place in the element-isolation region, and a conductive layer 14 is formed to be electrically connected through the hole 18 to the field shield electrode 10 at a contact 11. Further, capacitors and various wiring (not shown) to be connected to the transistor formed in the active region are formed by a known method. Such transistors are formed in the active regions, only one of which is shown in the figure, to thereby complete formation of the semiconductor device.

Furthermore, amorphous silicon, which is also suitable for gettering heavy metal elements contained in the silicon substrate, or a double layer of amorphous silicon and polysilicon may be used in place of the polysilicon single thin film forming the field shield electrode 10.

Here, the heavy metal elements in the P-type silicon substrate 1 are gettered into the field shield electrode 10 made of a polysilicon thin film thereby being removed from the substrate 1 by the heat treatment at 850° C. for 90 minutes at the step S09 and the thermal oxidation in forming the gate oxide film 3 at the step S14. Accordingly, the characteristic of the elements (MOS transistors) does not deteriorate.

As described above, according to the present invention, in the semiconductor device and the method of making the semiconductor device, since the thickness of the insulating film formed between the silicon substrate and the polysilicon thin film is made at a thickness not larger than 10 nm and at least one step of applying heat treatment at a temperature not lower than 700° C. to the substrate is carried out in the process of making the semiconductor device, the heavy metal elements in the silicon substrate are gettered through the insulating film into the polysilicon thin film located above the insulating film. Accordingly, the heavy metal elements hardly remain in the silicon substrate after completion of the semiconductor device, and therefore the characteristic of the semiconductor device can be improved. Further, since a temperature not lower than 700° C. suffices for the heat treatment for gettering, all the heat treatments performed after formation of the field shield electrode of a polysilicon thin film, such as heat treatments for forming N-type impurity layers, insulating layers and so on, are effective for the gettering, the number of steps is not increased by using such heat treatment for the purpose.

I claim:

1. A semiconductor device comprising:

a semiconductor substrate;

a field-shield electrode made of a thin film of at least one of polysilicon and amorphous silicon and formed on a surface of an element-isolation region of the substrate with an insulating film interposed therebetween for defining an active region in said substrate; and a transistor having a gate electrode formed on a surface of said active region of said substrate with a gate insulating film interposed between said substrate and said gate electrode;

wherein said field-shield electrode is connected to a predetermined potential and said insulating film has a thickness of 5 nm–10 nm which is less than a thickness of the gate insulating film of said transistor.

2. A semiconductor device according to claim 1, wherein said field shield electrode is connected to a ground potential.

3. A semiconductor device according to claim 1, wherein said field shield electrode and said substrate are connected to predetermined potentials respectively so that an absolute value of a difference between the respective potentials of said field shield electrode and said substrate is no higher than 5 V.

4. A semiconductor device according to claim 1 wherein said thickness of the gate insulating film is about 15 nm.

* * * * *